(12) United States Patent
Cheng et al.

(10) Patent No.: US 8,916,414 B2
(45) Date of Patent: Dec. 23, 2014

(54) METHOD FOR MAKING MEMORY CELL BY MELTING PHASE CHANGE MATERIAL IN CONFINED SPACE

(71) Applicant: Macronix International Co., Ltd., Hsinchu (TW)

(72) Inventors: Huai-Yu Cheng, White Plains, NY (US); Hsiang-Lan Lung, Ardsley, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/038,459

(22) Filed: Sep. 26, 2013

(65) Prior Publication Data

US 2014/0264240 A1 Sep. 18, 2014

Related U.S. Application Data

(60) Provisional application No. 61/780,905, filed on Mar. 13, 2013.

(51) Int. Cl.
*H01L 21/00* (2006.01)
*H01L 45/00* (2006.01)

(52) U.S. Cl.
CPC ............ *H01L 45/1641* (2013.01); *H01L 45/06* (2013.01)
USPC . 438/95; 257/2; 257/5; 257/42; 257/E45.002; 438/102; 438/385

(58) Field of Classification Search
CPC ...................................... H01L 45/005–45/1691
USPC ..................... 257/1–5, 42, E45.002, E45.003; 438/102–104, 675, 597, 665, 666
See application file for complete search history.

(56) References Cited

U.S. PATENT DOCUMENTS

| | | | |
|---|---|---|---|
| 5,389,566 | A | 2/1995 | Lage |
| 5,687,112 | A | 11/1997 | Ovshinsky |
| 5,751,012 | A | 5/1998 | Wolstenholme et al. |
| 6,507,061 | B1 | 1/2003 | Hudgens et al. |
| 6,555,858 | B1 | 4/2003 | Jones et al. |
| 6,579,760 | B1 | 6/2003 | Lung |
| 6,617,192 | B1 | 9/2003 | Lowrey et al. |

(Continued)

OTHER PUBLICATIONS

Chen et al., "Endurance Improvement of Ge2Sb2Te5-Based Phase Change Memory", Memory Workshop, (May 2009), IEEE International, pp. 1-2.

(Continued)

*Primary Examiner* — Mark A Laurenzi
(74) *Attorney, Agent, or Firm* — James F. Hann; Haynes Beffel & Wolfeld LLP (57) ABSTRACT

To form a memory cell with a phase change element, a hole is formed through an insulator to a bottom electrode, and a phase change material is deposited on the insulator surface covering the hole. A confining structure is formed over the phase change material so the phase change material expands into the hole when heated to melting to become electrically connected to the bottom electrode. A top electrode is formed over and electrically connects to the phase change material. The bottom electrode can include a main portion and an extension having a reduced lateral dimension. The confining structure can include capping material having a higher melting temperature than the phase change material, and sufficient tensile strength to ensure the phase change material moves into the hole when the phase change material melts and expands. The hole can be a J shaped hole.

11 Claims, 8 Drawing Sheets

(56) References Cited

U.S. PATENT DOCUMENTS

| | | | |
|---|---|---|---|
| 6,800,504 | B2 | 10/2004 | Li et al. |
| 6,897,467 | B2 | 5/2005 | Doan et al. |
| 7,018,911 | B2 | 3/2006 | Lee et al. |
| 7,394,089 | B2 | 7/2008 | Doyle et al. |
| 7,465,675 | B2 | 12/2008 | Koh |
| 7,485,891 | B2 | 2/2009 | Hamann et al. |
| 7,498,064 | B2 | 3/2009 | Horii |
| 7,504,653 | B2 | 3/2009 | Lung |
| 7,560,337 | B2 | 7/2009 | Ho et al. |
| 7,575,776 | B2 | 8/2009 | Horii |
| 7,579,613 | B2 | 8/2009 | Lung et al. |
| 7,606,059 | B2 | 10/2009 | Toda |
| 7,623,370 | B2 | 11/2009 | Toda et al. |
| 7,642,125 | B2 | 1/2010 | Lung et al. |
| 7,778,063 | B2 | 8/2010 | Brubaker et al. |
| 7,868,313 | B2 | 1/2011 | Breitwisch et al. |
| 7,893,419 | B2 | 2/2011 | Hudgens et al. |
| 2002/0042158 | A1 | 4/2002 | Kersch et al. |
| 2003/0003647 | A1 | 1/2003 | Dennison et al. |
| 2003/0215978 | A1 | 11/2003 | Maimon et al. |
| 2004/0026686 | A1 | 2/2004 | Lung |
| 2004/0114317 | A1 | 6/2004 | Chiang et al. |
| 2005/0019975 | A1 | 1/2005 | Lee et al. |
| 2005/0029502 | A1 | 2/2005 | Hudgens |
| 2005/0127347 | A1 | 6/2005 | Choi et al. |
| 2006/0001174 | A1 | 1/2006 | Matsui |
| 2006/0003263 | A1 | 1/2006 | Chang |
| 2006/0077741 | A1 | 4/2006 | Wang et al. |
| 2006/0108667 | A1 | 5/2006 | Lung |
| 2006/0110878 | A1 | 5/2006 | Lung et al. |
| 2006/0172067 | A1 | 8/2006 | Ovshinsky et al. |
| 2006/0175596 | A1 | 8/2006 | Happ et al. |
| 2007/0045605 | A1 | 3/2007 | Hsueh |
| 2007/0045606 | A1 | 3/2007 | Magistretti et al. |
| 2007/0176251 | A1 | 8/2007 | Oh et al. |
| 2007/0235710 | A1 | 10/2007 | Matsuzaki et al. |
| 2007/0246782 | A1 | 10/2007 | Philipp et al. |
| 2008/0019170 | A1 | 1/2008 | Happ et al. |
| 2008/0116441 | A1 | 5/2008 | Raghuram et al. |
| 2009/0014706 | A1 | 1/2009 | Lung |
| 2009/0017577 | A1 | 1/2009 | An et al. |
| 2009/0148980 | A1 | 6/2009 | Yu |
| 2009/0298223 | A1 | 12/2009 | Cheek et al. |
| 2010/0193763 | A1 | 8/2010 | Chen et al. |
| 2010/0291747 | A1 | 11/2010 | Lung et al. |
| 2011/0034003 | A1 | 2/2011 | Lung |

OTHER PUBLICATIONS

Gilbert, N.E. et al., "A macro model of programmable metallization cell devices," Solid-State Electronics 49 (Nov. 2005), pp. 1813-1819.

Kim et al., "High Performance PRAM Cell Scalable to sub-20nm technology with below 4F2 Cell Size, Extendable to DRAM Applications," (Jun. 2010), Syposium on VLSI Technology, Digest of Technical Papers, pp. 203-204.

Lee et al., "Highly Scalable Phase Change Memory with CVD GeSbTe for Sub 50nm Generation", (Apr. 2007), Symposium on VLSI Technology Digest of Technical Papers, pp. 102-103.

Yamada, "Potential of Ge-Sb-Te Phase-Change Optical Disks for High-Data-Rate Recording", SPIE v. 3109, pp. 28-37 (Jul. 1997).

METHOD FOR MAKING MEMORY CELL BY MELTING PHASE CHANGE MATERIAL IN CONFINED SPACE

CROSS-REFERENCE TO RELATED APPLICATION

This application claims benefit of U.S. Provisional Patent Application No. 61/780,905, filed 13 Mar. 2013.

PARTIES TO A JOINT RESEARCH AGREEMENT

International Business Machines Corporation, a New York corporation, and Macronix International Corporation, Ltd., a Taiwan corporation, are parties to a Joint Research Agreement.

BACKGROUND OF THE INVENTION

Many phase change materials are referred to as GST because they are based on $Ge_xSb_yTe_z$ material compositions. GST materials can also include additives, such as $SiO_2$-GST, sometimes referred to below as additive GST.

Phase change memory cells have been designed so that there is a very small volume of phase change material in contact with one of the top and bottom electrodes. This serves to confine active region of the cell to a small volume of material, reducing the power needed for operation, and improving speed. One type of cell, sometimes referred to as a pore-type cell, is formed by making a small pore that forms an opening through an insulating layer to an electrode, and filling the pore with the phase change material. The size of the pore can be a critical dimension for the cell. For very small pores, it can be difficult to consistently and uniformly fill the pores in a memory array.

It has been found that it is possible to fill a very small hole, on the order of 17 nm×7.5 nm×30 nm deep, with some phase change materials using an atomic layer deposition (ALD) process or a chemical vapor deposition (CVD) process. However, it is not presently practical to fill such small holes with phase change materials using conventional plasma vapor deposition (PVD) processes.

One of the problems with the ALD process is that it is very difficult to control the phase change material compositions. Also, it is not possible to use ALD or CVD with many additives that are used with phase change materials.

SUMMARY

A method for forming a memory cell with a phase change element can be carried out as follows. An insulator is formed over a bottom electrode, the insulator having a hole extending from a surface of the insulator to the bottom electrode. The hole defines a void extending from the surface to the bottom electrode and has a void volume. A volume of phase change material is confined inside a confining structure on a surface of the insulator and covers the hole. The phase change material is characterized by expansion in volume when melted by a characteristic percentage. The void volume is less than the characteristic percentage of the volume of phase change material inside the confining structure. The phase change material is heated causing the phase change material to expand into the hole so that upon expansion of the phase change material into the hole, the phase change material becomes electrically connected to the bottom electrode. A top electrode is formed over and electrically connected to the phase change material.

Some examples of the method can include one or more the following. The heating of the phase change material to expand can include melting the phase change material. The phase change material, which may comprise a $Ge_xSb_yTe_z$ material, may be sputtered on the surface of the insulator and cover the hole. The selectively etching step may etch the U-shape dielectric material layer through the first leg, the bottom layer and a portion of the second leg of the U-shape dielectric material layer to create a J shaped hole. The method may further include forming a bottom contact comprising a main, lower portion and an upper extension having a reduced lateral dimension, and removing a portion of the upper extension to create the bottom electrode from the upper extension and the hole in the insulator. The phase change material may be confined between a capping material, the surface of the insulator and the hole, with the capping material being characterized by (1) a higher melting temperature than the phase change material, (2) sufficient tensile strength at the melting temperature of the phase change material to ensure the phase change material moves into the hole during said phase change material heating step.

Another example of the method can include the following. A phase change material can be deposited on the surface of the insulator and covering the hole. A first capping material can be deposited over the phase change material to form a material stack. A mask can be formed on a portion of the material stack overlying the hole. Portions of the material stack not covered by the mask can be removed to create an etched material stack. And a second capping material can be deposited over the etched material stack and onto the surface of the insulator.

In a further example of the method, the insulator forming step can include the following. An opening can be formed in the insulator to the bottom electrode, the opening having sidewalls along the insulator and a bottom along the bottom electrode. A first dielectric material can be deposited on the sidewalls and bottom of the opening to create a material layer with a bottom layer along the bottom electrode and first and second legs along the insulator, and a reduced size opening bounded by the U-shaped dielectric material layer. A second dielectric material can be deposited in the reduced size opening. A portion of the U-shaped dielectric material layer can be selectively etched through the first leg and the bottom layer of the U-shaped dielectric material layer to create the hole.

An example of a memory cell with a phase change element includes the following. A bottom electrode has a contact surface. An insulator is on the contact surface of the bottom electrode and has an opposing surface. A hole in the insulator extends from the contact surface of the bottom electrode to the opposing surface of the insulator. The hole has first and second sections. The first section includes a first leg extending from the opposing surface to the contact surface of bottom electrode. The second section includes a base element extending transverse to the first leg and along the contact surface of the bottom electrode. The second section has a first end portion extending from the first leg and a second end portion. The first leg and the first end portion of the second section are substantially filled with phase change memory material. The second end portion is substantially free of phase change memory material. A top electrode is over and electrically connected to the phase change material.

Some examples of the memory cell with a phase change element may include one or more the following. The second portion may include a second leg with the base element between the first leg and the second leg. The base element may constitute the entire second section. The second end portion may include an empty volume region. The phase change material within the second leg may be spaced apart from the opposing surface. The phase change memory material may include a $Ge_xSb_yTe_z$ material.

Other features, aspects and advantages of the present invention can be seen on review the drawings, the detailed description, and the claims which follow.

BRIEF DESCRIPTION OF THE DRAWINGS

FIGS. 2-14 constitute a series of drawing figures illustrating stages in a first method for forming a phase change element as in FIG. 1.

FIGS. 15-22 constitute a series of drawing figures illustrating stages in a second method for forming a phase change element as in FIG. 1.

DETAILED DESCRIPTION

The following description will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

Many phase change materials, including $Ge_xSb_yTe_z$ material compositions, referred to herein as GST, increase in volume a significant amount when transitioning from a solid phase to a liquid phase at its melting temperature. This is also true for at least some GST materials which include additives, such as $SiO_2$-GST for example. GST of the formula $Ge_2Sb_2Te_5$ in a fully amorphous state has a density of 5.86 g/cm$^3$ at room temperature, in a face centered cubic (FCC) crystal structure has a density of 6.27 g/cm$^3$ at room temperature, and in a hexagonal close-pack (HCP) crystal structure has a density of 6.42 g/cm$^3$ at room temperature. At the melting temperature of 630° C. the same GST material has a density of 5.65 g/cm$^3$. Therefore, in GST and in many phase change materials, there is a significant increase in volume of the phase change material upon transitioning from a solid phase to its liquid phase. Some materials will readily flow when heated even though not heated to a true liquid state. In this application melting will include situations in which materials which have been heated to a flowable state whether or not the material has been heated to a liquid state.

Figure 1:
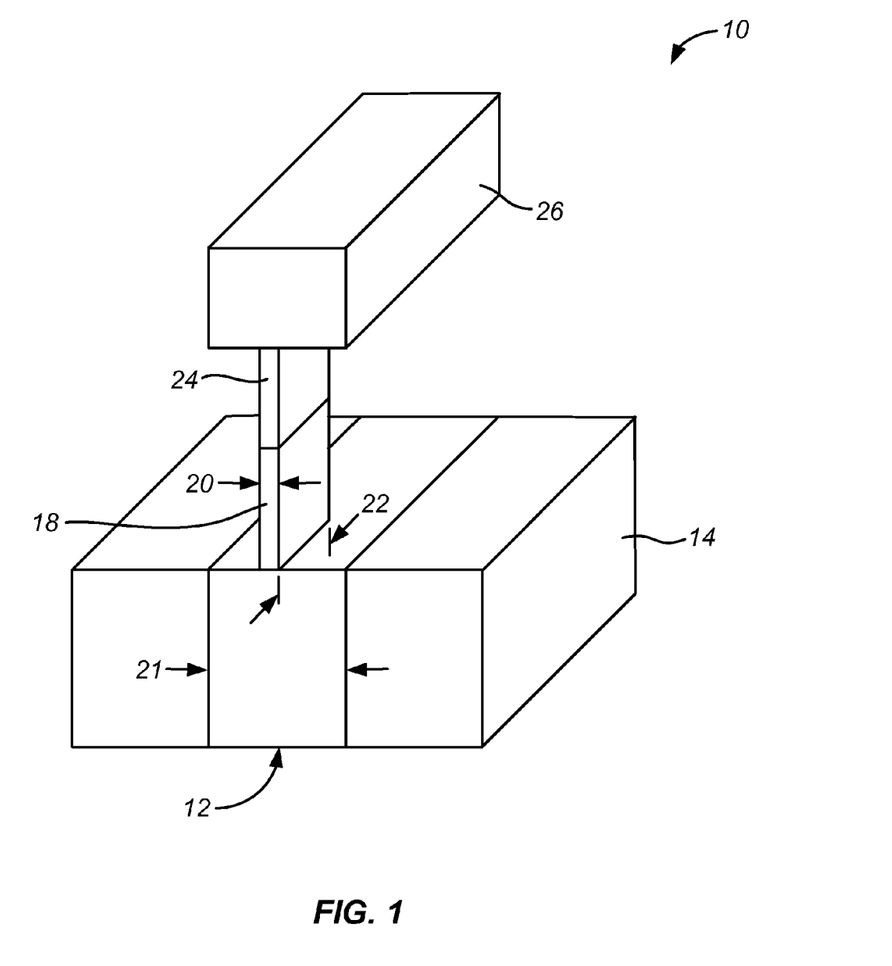
FIG. 1 is an overall view of an example of a memory cell which can be made according to the methods and techniques discussed below.

FIG. 1 is an overall view of an example of a memory cell 10 made according to the methods and techniques discussed below. Memory cell 10 includes a bottom contact 12 within a first dielectric layer 14, which can be made of silicon dioxide. Bottom contact 12 is in contact with a heater electrode 18, extending upwardly in this example. Heater electrode 18 has a reduced lateral dimension 20, relative to the lateral dimension 21 of bottom contact 12. In one example lateral dimension 20 is about 7.5 nm while the lateral dimension 21 of bottom contact 12 is about 20 nm. In the example of FIG. 1, heater electrode 18 has a length 22 of about 22 nm. A phase change element 24 extends from heater electrode 18 and has a similar cross-sectional shape as heater electrode 18. Therefore the interface between heater electrode 18 and phase change element 24 provides a reduced area of contact concentrating current flow at the interface between phase change element 24 and heater electrode 18.

Heater electrode 18 can be made of titanium nitride (e.g., TiN), tantalum nitride (TaN), titanium aluminum nitride (TiAlN), tantalum aluminum nitride (TaAlN), other metals (including tungsten), metal oxides, materials selected from the group of $Ta_xN_y$ where the x/y ratio is greater than I, Ta, W, W-silicide, Pt, Ru, $RuO_2$, Ir, and $IrO_2$, and so on. The bottom contact 12 can be tungsten or other metals, silicon with a silicide cap, silicide (WSi, CoSi, NiSi etc.), or metal (W, Al, Cu, combinations of metals etc.). Bottom contact 12 and heater electrode 18 can be made of the same or different materials.

Phase change element 24 can be made from a $Ge_xSb_yTe_z$ material, sometimes referred to as GST, with or without additives. A top electrode 26, typically made of TiN, is over and is electrically coupled to phase change element 24. While in this example phase change element 24 is shown to be directly contacting heater electrode 18 and top electrode 26, interface materials, such as TiN, may be used between phase change element 24 and top electrode 26 and between phase change element 24 and heater electrode 18. The open region in FIG. 1, located between top electrode 26 above and bottom contact 12 and dielectric layer 14 below, is commonly filled with an insulation material, such as silicon dioxide, silicon nitride, or silicon oxynitride.

FIGS. 2-14 constitute a series of drawing figures illustrating stages in a first method for forming a phase change element of a memory cell, such as memory cell 10 of FIG. 1.

Figure 2:
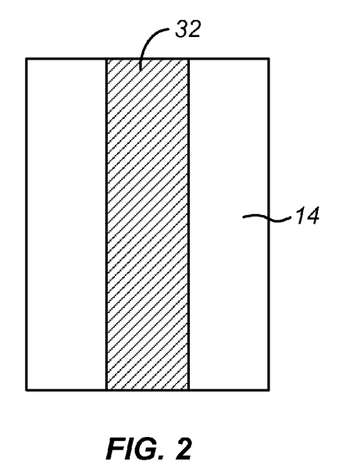
FIG. 2 illustrates a bottom electrode formed within a first dielectric layer.
Figure 3:
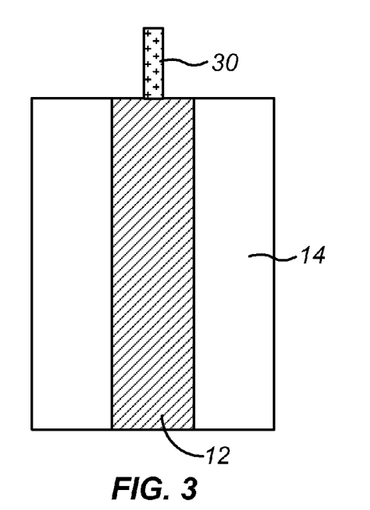
FIG. 3 shows a first mask formed on the upper end of the bottom electrode.

FIG. 2 illustrates bottom contact 12 formed within first dielectric layer 14. FIG. 3 shows a first mask 30 formed on the upper end 32 of the bottom contact 12.

Figure 4:
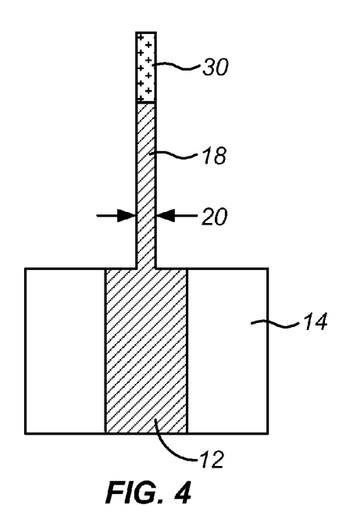
FIG. 4 shows a result of etching the structure of FIG. 3 creating a bottom electrode with an upper extension.
Figure 5:
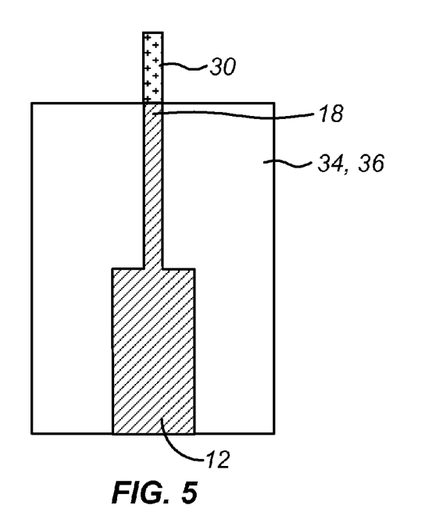
FIG. 5 shows the structure of FIG. 4 with an insulator over the bottom electrode.

FIG. 4 shows a result of etching the structure of FIG. 3 to create a heater electrode 18 extending from mask 30 the remainder of bottom contact 12 which has not been etched. Heater electrode 18 has a lateral dimension 20 in the range of about 1.5 nm to 9 nm, and about 7.5 nm in one example. FIG. 5 shows the structure of FIG. 4 after depositing a second dielectric layer 34 on the structure of FIG. 4 thereby forming an insulator 36 over the bottom contact 12.

Figure 6:
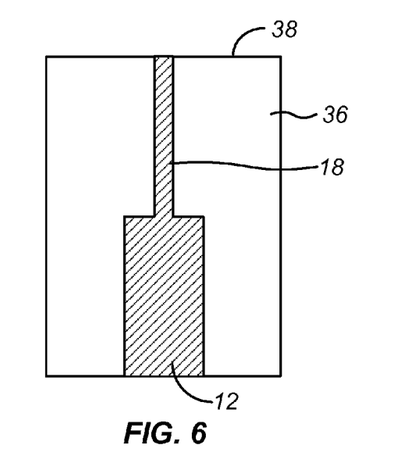
FIG. 6 illustrates result of planarizing the structure of FIG. 5.
Figure 7:
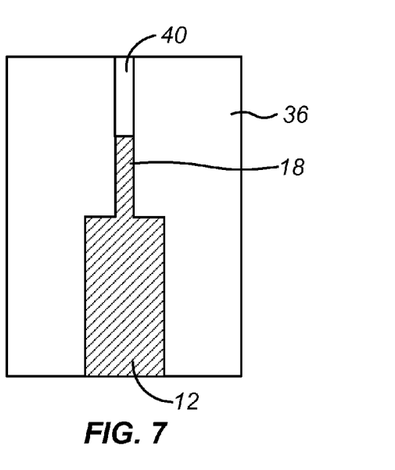
FIG. 7 shows the structure of FIG. 6 after a portion of the upper extension of the lower electrode has been etched to create a cavity or hole.

In FIG. 6 the structure of FIG. 5 has been planarized to create an upper surface 38 on the insulator 36. Next, a portion of the upper extension of the lower electrode has been etched to create a cavity or hole 40 as shown in FIG. 7.

Figure 8:
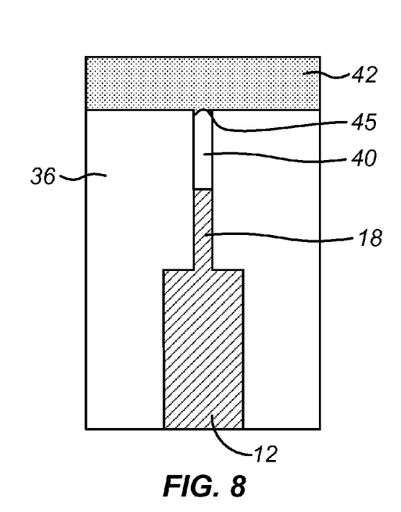
FIG. 8 shows the result of depositing a phase change material to cover the hole.

Next, as shown in FIG. 8, a layer 42 of a phase change material is deposited by, for example, sputtering onto the upper surface 38 of the insulator 36 thereby covering the hole 40. As suggested in FIG. 8 at reference numeral 45, some of the phase change material of layer 42 may extend into the hole 40 during this process. Because of the small dimensions of hole 40, the phase change material does not fill the hole.

Figure 9:
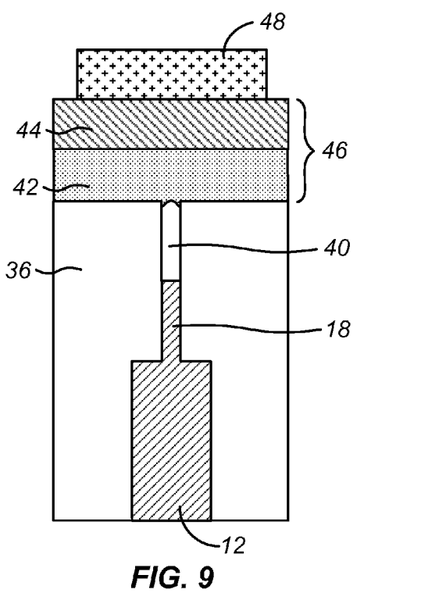
FIG. 9 shows the structure of FIG. 8 after covering the phase change material layer with a first capping material and then forming a second mask overlying the hole.
Figure 10:
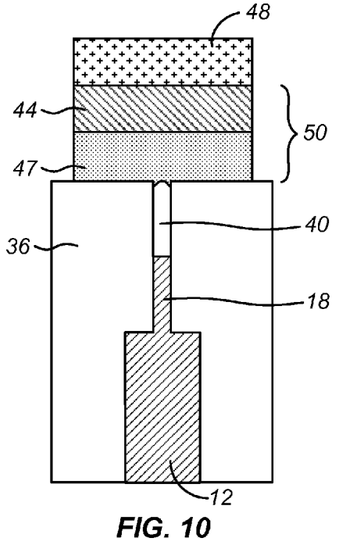
FIG. 10 shows the structure of FIG. 9 after trimming to create a trimmed material stack.

FIG. 9 shows the structure of FIG. 8 after covering the layer 42 of phase change material with a first capping material 44 to form a material stack 46, the material stack including phase change material 47 of phase change material layer 42 and the first capping material 44. A second mask 48 is then formed over a portion of the material stack 46 which overlies the hole 40. In FIG. 10 the structure of FIG. 9 is shown after trimming portions of the material stack 46 not covered by the second mask 48 to create a trimmed material stack 50.

Figure 11:
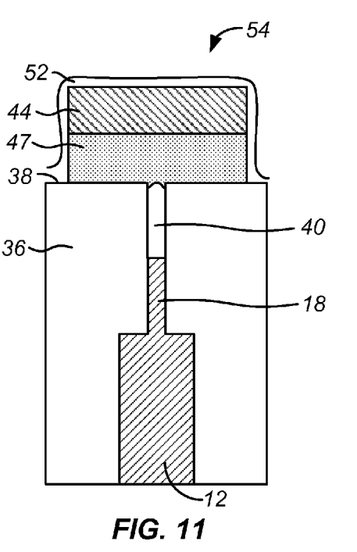
FIG. 11 shows the structure of FIG. 10 after the second mask has been removed and a second capping material has been deposited to form a confining structure over the phase change material.

The structure of FIG. 10 is shown in FIG. 11 after the second mask 48 has been removed, and after a second capping material 52 has been deposited onto the trimmed material stack 50 and the upper surface 38 of the insulator 36. The result is that a confining structure 54 is formed over the phase change material 47.

Figure 12:
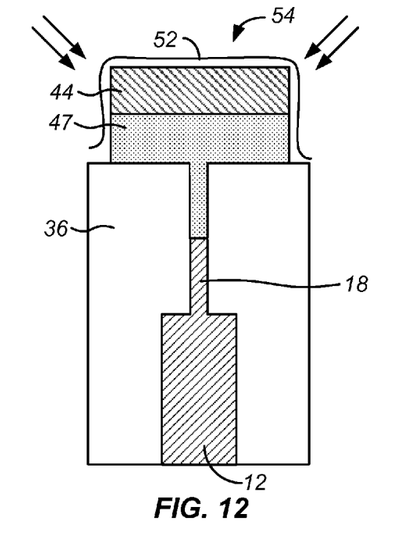
FIG. 12 shows a result of heating the structure of FIG. 11 to melt the phase change material causing the phase change material to expand and fill the hole.

FIG. 12 shows a result of heating, indicated by arrows in the figure, the structure of FIG. 11 to a temperature sufficient to melt the phase change material 47 causing the phase change material to expand and fill the hole 40 until it becomes electrically connected to the heater electrode 18. The complete of filling of hole 40 so that phase change material 47 contacts heater electrode 18 is possible for several reasons. The phase change material 47 is characterized by expansion in volume when melted by a characteristic percentage. The volume of hole 40 is less than the characteristic percentage of the volume of phase change material inside the confining structure 54. Therefore, when the phase change material 47 is heated causing the phase change material to expand into the hole 40, the increase in volume of phase change material 47 sufficient so that the phase change material 47 becomes electrically connected to the heater electrode 18. Vacuum conditions existing within the chamber help to ensure that phase change material 47 contacts heater electrode 18. The liquid phase change material 42 has a high mobility that enables it to fill into the hole 40 and contact heater electrode 18. Also important is that capping materials 44, 52, which surround phase change material 42 do not change during this heating step so that the expanding phase change material 42 only can flow into the hole 40.

First and second capping materials 44, 52 are preferably made of materials which have (1) a higher melting temperature than the phase change material 47 and (2) sufficient tensile strength at the melting temperature of the phase change material to ensure the phase change material moves into the hole 40 upon melting. The sufficient tensile strength can be a function of both the material properties of the particular capping material or materials used and the thickness and other configuration of the capping material or materials. Examples of suitable capping materials for first capping material 44 include titanium nitride, SiN and $SiO_2$, while examples of suitable capping materials for second capping material 52 include silicon nitride, high stress SiN, and low temperature SiN plus high temperature SiN. For example, with first capping material 44 made of TiN and second capping material 52 made of SiN, a thickness of 70 nm for first capping material 44 and an average thickness of 100 nm for a second capping material 52, with a melting temperature higher than the melting temperature for the phase change material 47 of about 700° C., has worked successfully.

Figure 13:
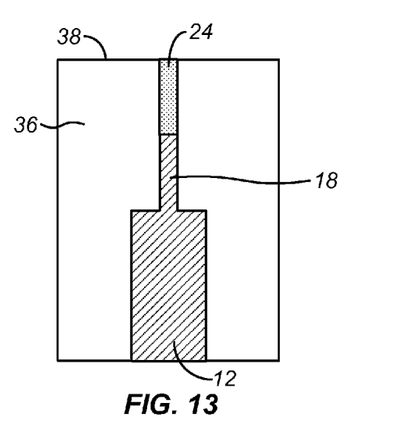
FIG. 13 shows the structure of FIG. 12 after planarizing.
Figure 14:
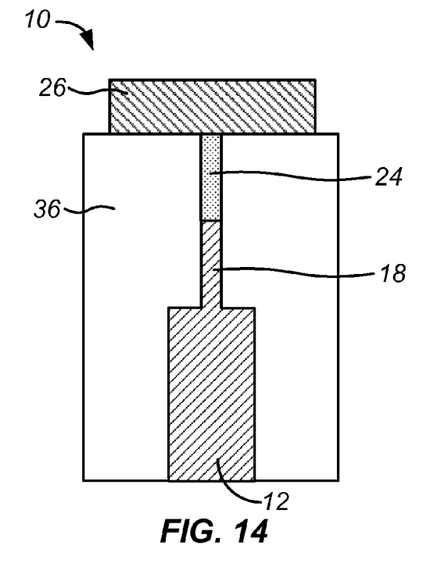
FIG. 14 shows the structure of FIG. 13 after forming a top electrode thereby forming a memory cell.

FIG. 13 shows the structure of FIG. 12 after planarizing to remove the confining structure 54 and phase change material 47 above the upper surface 38 of the insulator 36 to create phase change element 24. In FIG. 14, the structure of FIG. 13 is shown after forming a top electrode 26 contacting the phase change element 24, and confining it within the hole in the insulator 36. The resulting memory cell 10 similar to the memory cell 10 of FIG. 1.

FIGS. 15-22 constitute a series of drawing figures illustrating stages in a second method for forming a memory cell 10 but with a phase change element 85 within a J shaped hole 82.

Figure 15:
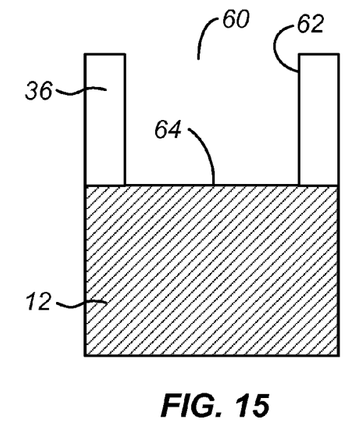
FIG. 15 illustrates an opening formed within an insulator down to the bottom electrode.

FIG. 15 illustrates an insulator 36 over a bottom contact 12 with an opening 60 formed within the insulator down to the bottom electrode. The opening 60 has sidewalls 62 along the insulator 36 and a bottom 64 along the bottom contact 12.

Figure 16:
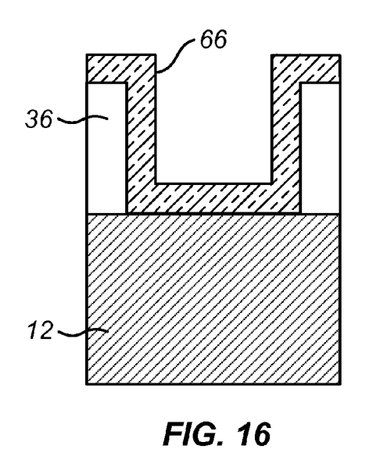
FIG. 16 shows the structure of FIG. 15 after depositing a first dielectric material on the sidewalls and bottom of the opening.
Figure 17:
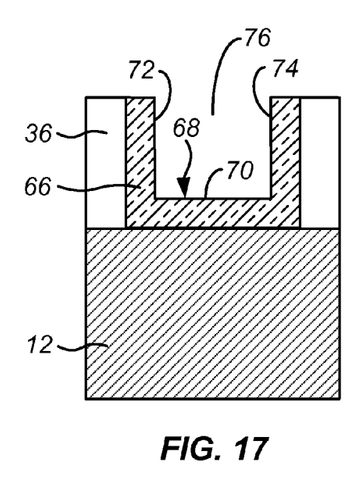
FIG. 17 shows the structure of FIG. 16 after planarization to create a U-shaped dielectric material layer defining a reduced size opening therein.

As shown in FIG. 16, a first dielectric material 66 is deposited on the sidewalls 62 and bottom 64 of the opening 60 of the structure of FIG. 15. FIG. 17 shows the structure of FIG. 16 after planarization to create a U-shaped dielectric material layer 68 having a bottom layer 70 along the bottom contact 12 and first and second legs 72, 74 along the insulator 36. Dielectric material layer 68 defines a reduced size opening 76 therein.

Figure 18:
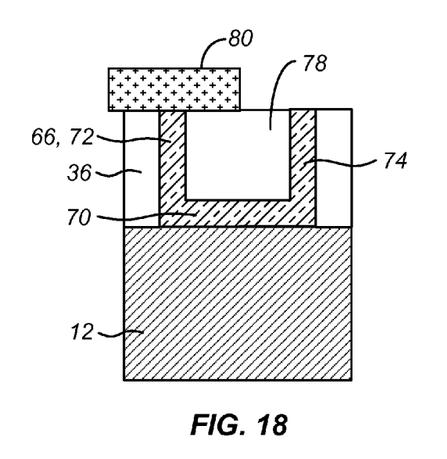
FIG. 18 shows the structure of FIG. 17 after the filling the reduced size opening with a second dielectric material followed by covering a first leg of the U-shaped dielectric material layer with an etching mask.
Figure 19:
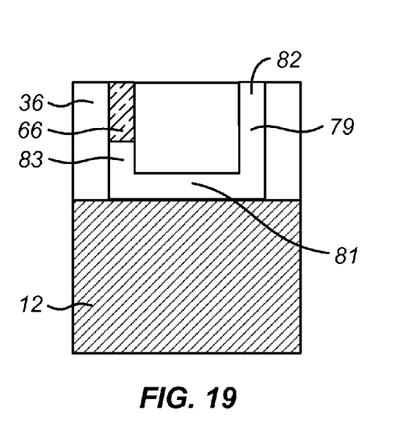
FIG. 19 shows result of etching the U-shaped dielectric material layer to create a J shaped hole.

In FIG. 18, the structure of FIG. 17 is shown after the filling the reduced size opening 76 with a second dielectric material 78. Next, the first leg 72 of the U-shaped dielectric material layer 68 is covered with an etching mask 80. FIG. 19 shows result of etching the structure of FIG. 18 through the open upper end of second leg 74 of layer 68. Doing so removes first dielectric material 66 along second leg 74, bottom layer 70, and a portion of the first leg 72 to create a J shaped hole 82 including hole portions 79, 81 and 83. The resulting structure includes confining structure 54, including first capping material 44 and second capping material 52, with phase change material 47 covering the open end of J shaped hole 82 at the second leg 74.

Figure 20:
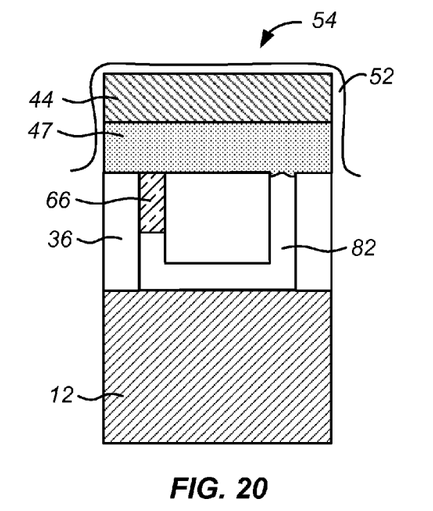
FIG. 20 shows the structure of FIG. 19 after processing steps corresponding to those described above with regard to FIGS. 8-11.
Figure 21:
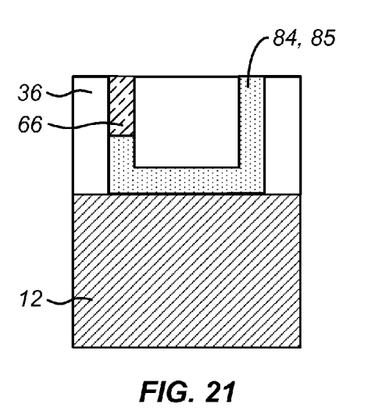
FIG. 21 shows the structure of FIG. 20 after steps corresponding to the heating step of FIG. 12 and the planarizing step of FIG. 13 resulting in phase change material within the J shaped hole.

FIG. 20 shows the structure of FIG. 19 after processing steps corresponding to those described above with regard to FIGS. 8-11, that is depositing a layer 42 of phase change material 47, forming a material stack 46 including phase change material 47 and first capping material 44, forming a second mask 48 so it overlies the hole 40, trimming the material stack 46, removing the second mask 48, and depositing a second capping material to create a confining structure 54. FIG. 21 shows the structure of FIG. 20 after steps corresponding to the heating step of FIG. 12 and the planarizing step of FIG. 13 resulting in phase change material 84 within the J shaped hole 82. In some examples phase change material 84 will not completely fill J shaped hole 82. As discussed above, phase change material 47 is characterized by expansion in volume when melted by a characteristic percentage. The volume of at least hole portion 79, and some examples the volume of hole portions 79 and 81 or hole portions 79, 81 and 83, is less than the characteristic percentage of the volume of phase change material inside the confining structure 54. Therefore, when the phase change material 47 is heated causing the phase change material to expand into the hole 82, the increase in volume of phase change material 47 sufficient so that the phase change material 47 becomes electrically connected to the bottom contact 12.

Figure 22:
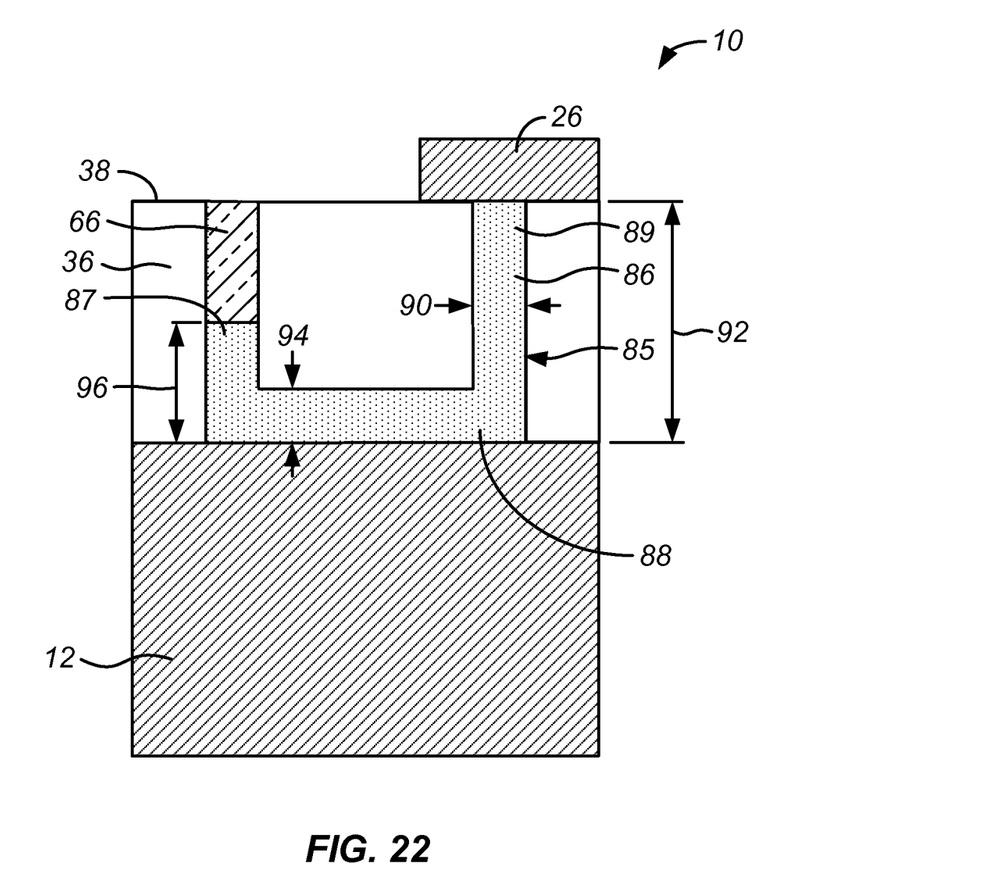
FIG. 22 shows the structure of FIG. 21 after forming a top electrode over and electrically connected to the phase change material in the J shaped hole, thereby forming a memory cell.

FIG. 22 shows the structure of FIG. 21 after forming a top electrode 26 over and contacting the phase change material 84 in the J shaped hole 82, thereby forming a memory cell 10 with a J-shaped phase change element 85. J-shaped phase change element 85 includes a first leg 86, a second leg 87 and a base element 88 connect the lower ends of the first and second legs. The upper end 89 of first leg 86 extends to the upper surface 38 of insulator 36. Base element 88 is electrically connected to bottom contact 12; in this example base element 88 directly contacts bottom contact 12. In one example the lateral dimension 90 of each of the first and second legs 86, 87 of J-shaped phase change element 85 is about 6 nm to 15 nm, such as about 8 nm, while the height 92 of first leg 86 is about 25 nm to 35 nm such as about 30 nm. The height 96 of second leg 87 is less than height 92 of first leg 86 so that the upper end of second leg 87 does not reach upper surface 91. The thickness 94 of base element 88 of J-shaped phase change element 85 is about 12 nm to 30 nm such as about 20 nm. The depth of phase change material 84 as measured in a direction perpendicular to the plane of the figure, that is the same as length 22 of FIG. 1, is about 18 nm to 35 nm, such as about 22 nm. Small confined cells sometimes have a relatively high SET resistance, which can cause a "hard to SET" issue. The use of J-shaped phase change element 85 can lower the SET resistance and also can widen the switching window. The J-shaped phase change element 85 may exhibit better reliability than conventional confined phase change structures because of the large contact area between base element 88 of J-shaped phase change element 85 and bottom contact 12.

In some examples phase change element 85 may include only first leg 86 and all or part of base element 88 so that it is generally L-shaped. In such examples hole portion 83 adjacent to dielectric material 66 in leg 72 is not filled with phase change material; this creates empty volume region in both hole portion 83, and, in some examples, a part of hole portion 81. In some examples such an empty volume region could be the result of manufacturing conditions, including the level of vacuum within hole 82 during processing. However, such examples would still retain the benefits created by the large contact area between base element 88 and phase change element 85. As used in this application generally L-shaped phase change elements include phase change element with a first leg and a base element, with or without a second leg.

Figure 23:
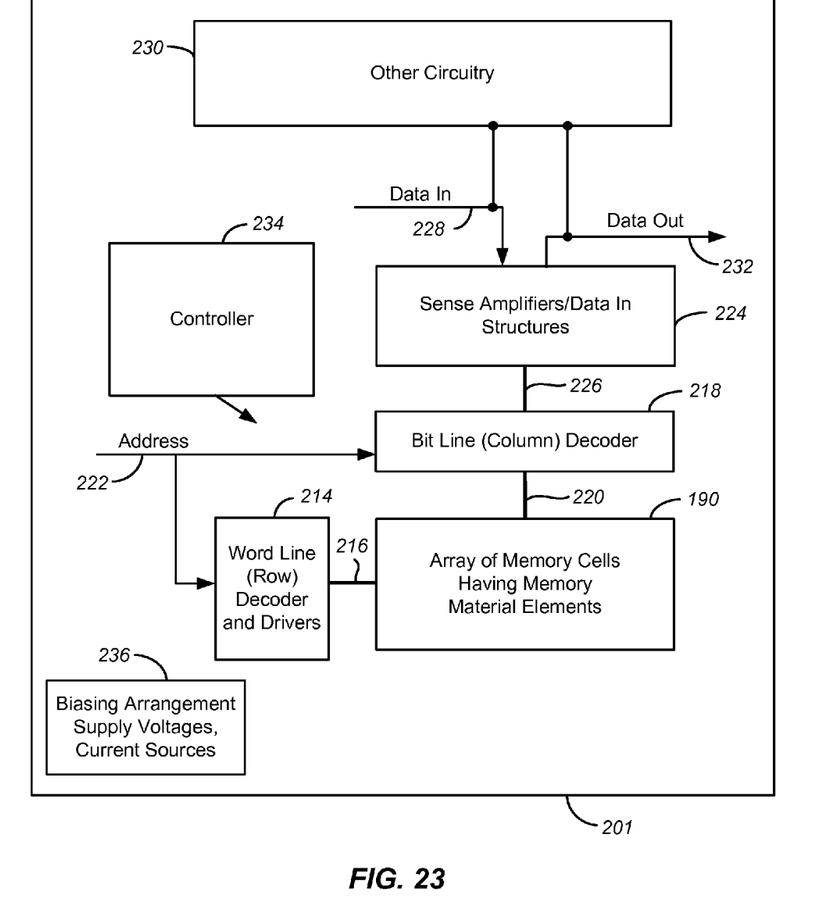
FIG. 23 is a simplified block diagram of an integrated circuit including a cross-point memory array of memory cells.

FIG. 23 is a simplified block diagram of an integrated circuit 201 including a cross-point memory array 190 of memory cells 10. In this example, each memory cell 10 is used with a diode access device, not shown. A word line (row) decoder 214 is coupled to and in electrical communication with a plurality of word lines 216. A bit line (column) decoder 218 is in electrical communication with a plurality of bit lines 220 to read data from, and write data to, the memory cells 10 in array 190. Addresses are supplied on bus 222 to word line decoder and drivers 214 and bit line decoder 218. Sense amplifiers and data-in structures in block 224 are coupled to bit line decoder 218 via data bus 226. Data are supplied via a data-in line 228 from input/output ports on integrated circuit 201, or from other data sources internal or external to integrated circuit 201, to data-in structures in block 224. Other circuitry 230 may be included on integrated circuit 201, such as a general purpose processor or special purpose application circuitry, or a combination of modules providing system-on-a-chip functionality supported by array 190. Data are supplied via a data-out line 232 from the sense amplifiers in block 224 to input/output ports on integrated circuit 201, or to other data destinations internal or external to integrated circuit 201.

A controller 234, implemented in this example using a bias arrangement state machine, controls the application of bias arrangement supply voltages 236, such as read, program, and program verify voltages. Controller 234 may be implemented using special-purpose logic circuitry as known in the art. In alternative embodiments, controller 234 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 234.

Embodiments of phase change materials include chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with, or include additives of, impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. Nos. 6,800, 504, and 7,893,419.

Phase change materials are capable of being switched between a first structural state in which the material is in a generally high resistivity, amorphous solid phase, and a second structural state in which the material is in a generally low resistivity, crystalline or polycrystalline solid phase in its local order in the active channel region of the cell. These materials are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously. An exemplary method for forming chalcogenide material using chemical vapor deposition (CVD) is disclosed in US Publication No 2006/0172067 entitled "Chemical Vapor Deposition of Chalcogenide Materials", which is incorporated by reference herein. Another exemplary method for forming chalcogenide material using CVD is disclosed in Lee, et al., "Highly Scalable Phase Change Memory with CVD GeSbTe for Sub 50 nm Generation, 2007 Symposium on VLSI Technology Digest of Technical Papers, pp. 102-103. A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes. Additives can be included in the phase change material by co-sputtering, or by other methods.

The above descriptions may have used terms such as above, below, top, bottom, over, under, et cetera. These terms may be used in the description and claims to aid understanding of the invention and not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims. For example, in some examples the opening 60 in FIG. 15 can be a narrow opening, which would serve as hole 40, formed directly through the insulator 36 to the bottom contact 12; the phase change element 24 would be formed within the narrow opening using the same basic steps outlined above.

Any and all patents, patent applications and printed publications referred to above are incorporated by reference.

What is claimed is:

1. A method for forming a memory cell with a phase change element comprising:
   forming an insulator over a bottom electrode, having a hole extending from a surface of the insulator to the bottom electrode, the hole defining a void extending from the surface to the bottom electrode, the void having a void volume;
   confining a volume of phase change material inside a confining structure on a surface of the insulator and covering the hole, the phase change material being characterized by expansion in volume when melted by a characteristic percentage, wherein the void volume is less than said characteristic percentage of the volume of phase change material inside the confining structure;
   heating the phase change material causing the phase change material to expand into the hole so that upon expansion of the phase change material into the hole, the phase change material becomes electrically connected to the bottom electrode; and
   forming a top electrode over and electrically connected to the phase change material.

2. The method according to claim 1, wherein said heating the phase change material to expand comprises melting the phase change material.

3. The method according to claim 1, wherein the volume confining step comprises sputtering the phase change material on the surface of the insulator and covering the hole.

4. The method according to claim 1, wherein the phase change material comprises a $Ge_xSb_yTe_z$ material.

5. The method according to claim 1, wherein the insulator forming step comprises:
   forming an opening in the insulator to the bottom electrode, the opening having sidewalls along the insulator and a bottom along the bottom electrode;
   depositing a first dielectric material on the sidewalls and bottom of the opening to create:
     a U-shaped material layer with a bottom layer along the bottom electrode and first and second legs along the insulator;
     a reduced size opening bounded by the U-shaped dielectric material layer;
   depositing a second dielectric material in the reduced size opening;
   selectively etching a portion of the U-shaped dielectric material layer through the first leg and the bottom layer of the U-shaped dielectric material layer to create the hole.

6. The method according to claim 5, wherein the selectively etching step etches the U-shape dielectric material layer through the first leg, the bottom layer and a portion of the second leg of the U-shape dielectric material layer to create a J shaped hole, the void being along the first leg between the bottom electrode and the surface of the insulator.

7. The method according to claim 1, further comprising:
   forming a bottom contact comprising a main, lower portion and an upper extension having a reduced lateral dimension; and
   removing a portion of the upper extension to create the bottom electrode from the upper extension and the hole in the insulator.

8. The method according to claim 2, wherein said volume confining step includes encapsulating the phase change material between a capping material, the surface of the insulator and the hole;
   the capping material being characterized by (1) a higher melting temperature than the phase change material, (2) sufficient tensile strength at the melting temperature of the phase change material to ensure the phase change material moves into the hole during said phase change material heating step.

9. The method according to claim 1, wherein the volume confining step comprises:
   depositing a phase change material on the surface of the insulator and covering the hole;
   depositing a first capping material over the phase change material to form a material stack;
   forming a mask on a portion of the material stack overlying the hole;
   removing portions of the material stack not covered by the mask to create an etched material stack; and
   depositing a second capping material over the etched material stack and onto the surface of the insulator.

10. The method according to claim 1, further comprising planarizing the surface of the insulator prior to the top electrode forming step.

11. A memory cell made according to the method of claim 1.

* * * * *